United States Patent
Erhart (10) Patent No.: US 11,394,087 B2
(45) Date of Patent: Jul. 19, 2022

(54) BATTERY MODULE

(71) Applicant: Samsung SDI Co., Ltd., Yongin-si (KR)

(72) Inventor: Michael Erhart, Seiersberg-Pirka (AT)

(73) Assignee: SAMSUNG SDI CO., LTD., Yongin-si (KR)

(*) Notice: Subject to any disclaimer, the term of this patent is extended or adjusted under 35 U.S.C. 154(b) by 154 days.

(21) Appl. No.: 16/706,494

(22) Filed: Dec. 6, 2019

(65) Prior Publication Data

US 2020/0185681 A1 Jun. 11, 2020

(30) Foreign Application Priority Data

Dec. 11, 2018 (EP) .................................. 18211687
Dec. 4, 2019 (KR) ........................ 10-2019-0160026

(51) Int. Cl.
*H01M 10/00* (2006.01)
*H01M 50/502* (2021.01)
*H01M 10/42* (2006.01)
*H01M 10/48* (2006.01)
*H05K 1/18* (2006.01)

(52) U.S. Cl.
CPC ....... *H01M 50/502* (2021.01); *H01M 10/425* (2013.01); *H01M 10/482* (2013.01); *H01M 2010/4278* (2013.01); *H05K 1/189* (2013.01)

(58) Field of Classification Search
CPC ............. H01M 50/502; H01M 10/425; H01M 10/482; H01M 2010/4278; H01M 10/486; H05K 1/189; Y02E 60/10
See application file for complete search history.

(56) References Cited

U.S. PATENT DOCUMENTS 6,423,441 B1 7/2002 Ronning et al.
2013/0266823 A1* 10/2013 Lee ..................... H01M 10/425
429/7

(Continued)

FOREIGN PATENT DOCUMENTS

CN 207233847 U 4/2018
EP 2 752 917 B1 8/2016

(Continued)

OTHER PUBLICATIONS

Extended European Search Report for corresponding European Application No. 18211687.1, dated Jul. 8, 2019, 5pp.

*Primary Examiner* — Nicholas P D'Aniello
(74) *Attorney, Agent, or Firm* — Lewis Roca Rothgerber Christie LLP (57) ABSTRACT

A battery module includes: a plurality of aligned battery cells, each of the battery cells including a cell case, a cap assembly on the cell case, a negative cell terminal, and a positive cell terminal; a plurality of busbars over the cap assemblies, each of the busbars electrically connecting the cell terminals of at least two of the battery cells to each other; and a cell supervision circuit carrier configured to accommodate a cell supervision circuit, the cell supervision circuit carrier comprising a connector configured to establish data communication with the cell supervision circuit. The cell supervision circuit carrier electrically connects the cell supervision circuit to the negative cell terminal of one of the battery cells and to the cell cases of at least some of the other battery cells from among the plurality of battery cells.

17 Claims, 7 Drawing Sheets

(56) References Cited

U.S. PATENT DOCUMENTS

| | | | |
|---|---|---|---|
| 2014/0139185 A1* | 5/2014 | Han | H01M 50/578 320/118 |
| 2017/0133724 A1 | 5/2017 | Schuetz | |
| 2018/0090952 A1 | 3/2018 | Ota et al. | |

FOREIGN PATENT DOCUMENTS

| | | |
|---|---|---|
| EP | 3 063 824 | 9/2016 |
| EP | 2 649 701 B1 | 4/2017 |
| EP | 3 316 384 A1 | 5/2018 |
| WO | WO 2015/101270 A1 | 7/2015 |

* cited by examiner

BATTERY MODULE

CROSS-REFERENCE TO RELATED APPLICATION

This application claims priority to and the benefit of European Patent Application No. 18211687.1, filed in the European Patent Office on Dec. 11, 2018, and Korean Patent Application No. 10-2019-0160026, filed in the Korean Patent Office on Dec. 4, 2019, the entire content of both of which are incorporated herein by reference.

BACKGROUND

1. Field

Aspects of embodiments of the present invention relate to a battery module.

2. Related Art

A rechargeable (e.g., secondary) battery differs from a primary battery in that it is designed to be repeatedly charged and discharged, while the primary battery is designed to provide an irreversible conversion of chemical to electrical energy. Low-capacity rechargeable batteries may be used as a power supply for electronic devices, such as cellular phones, notebooks, and camcorders, while high-capacity rechargeable batteries may be used as a power supply for hybrid vehicles and the like.

In general, rechargeable batteries may include an electrode assembly, a case receiving (e.g., accommodating or containing) the electrode assembly, and an electrode terminal electrically connected to the electrode assembly. The electrode assembly may include a positive electrode, a negative electrode, and a separator interposed between the positive and negative electrodes. An electrolyte solution is injected into the case to enable charging and discharging of the battery (e.g., of the electrode assembly) via an electrochemical reaction involving the positive electrode, the negative electrode, and the electrolyte solution. The shape of the case (e.g., cylindrical or rectangular) may be suitably varied according to the battery's intended purpose.

A battery module may include a plurality of rechargeable unit battery cells coupled to each other in series and/or in parallel to provide high energy density for, as an example, a motor for driving a hybrid or electric vehicle. For example, the battery module may be formed by interconnecting the electrode terminals of the plurality of unit battery cells to each other, the number of the unit battery cells being determined by a desired amount of power, to provide a high-power rechargeable battery for, as an example, an electric or hybrid vehicle.

Battery modules may have either a block design or a modular design. In the block design, each battery cell is coupled to a common current collector structure and a common battery management system. In the modular design, pluralities of battery cells are connected to form submodules, and several submodules are connected to form the battery module. Battery management functions may be provided either on a module or submodule level and, thus, interchangeability of the components is improved. One or more battery modules may be mechanically and/or electrically integrated, equipped with a thermal management system, and configured to communicate with electrical consumers to form a battery system.

A thermal management system may be included to ensure safe use of the at least one battery module by efficiently emitting, discharging, and/or dissipating heat generated by its rechargeable batteries. If the heat emission/discharge/dissipation is not sufficiently performed, temperature deviations may occur between respective battery cells, such that the at least one battery module may not generate a desired amount of power. In addition, an increase of the internal temperature within a battery cell may lead to abnormal reactions occurring therein and, thus, charging and discharging performance of the rechargeable battery may deteriorate and the life-span of the rechargeable battery may be shortened. Thus, cooling devices for effectively emitting/discharging/dissipating heat from the battery cells may be included.

Static control of battery power output and charging may not be sufficient to meet the dynamic power demands of various electrical consumers connected to the battery system. Thus, steady exchange of information between the battery system and the controllers of the electrical consumers may be employed. Such information may include the battery system's actual state of charge (SoC), potential electrical performance, charging ability, and internal resistance as well as actual or predicted power demands or surpluses of the consumers. Battery systems usually include a battery management system (BMS) for processing such information.

The BMS is usually coupled to (e.g., connected to) the controller of one or more electrical consumers as well as to each of the battery modules of the battery system. A daisy chain setup may be used to control a plurality of battery modules by a single BMS. In such a setup, the BMS may be connected for communication (e.g., connected to receive and/or process information) in series to a plurality of battery modules. For example, the BMS may be connected in series to a plurality of cell supervision circuits (CSC) of the respective battery modules. Therein, the BMS may be configured to receive and process information from each of the CSCs as well as from external consumers or control units (e.g., a vehicle board net) connected thereto. Further, each of the CSCs may be configured to detect voltages and/or temperatures of an individual battery module and to communicate the detected voltages and/or temperatures to the BMS. The CSCs may be further configured for cell balancing within the battery modules.

Figure 1:
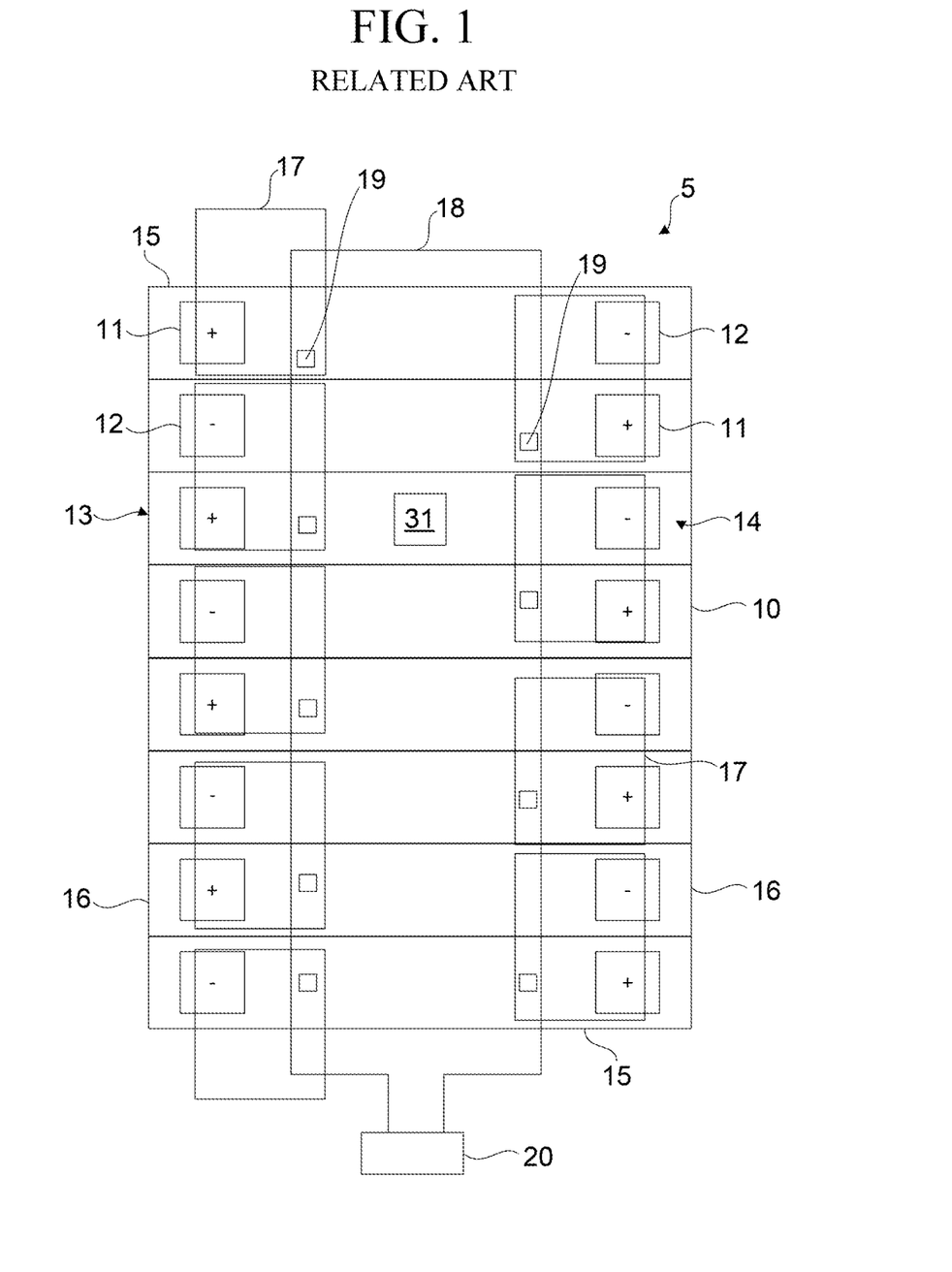
FIG. 1 is a schematic illustration of a top view of a battery module according to the related art.

In a battery module 5 according to the related art, as shown exemplarily in FIG. 1, a plurality of prismatic battery cells 10 may be stacked together. Each battery cell 10 may include a cell case 13 having a substantially rectangular cross section with a pair of opposite wide side surfaces 15 and a pair of opposite narrow side surfaces 16 that are perpendicular to the wide side surfaces 15. Further, each battery cell 10 has a cap assembly 14 covering the cell case 13, and the cap assembly has a rectangular shape with a pair of opposite wide sides and a pair of opposite narrow sides that are perpendicular to the wide sides. In the battery module 5, the battery cells 10 are aligned such that wide side surfaces 15 of adjacent ones of the battery cells 10 face each other.

Each of the battery cells 10 includes a positive cell terminal 11 near a first narrow side of the cap assembly 14 and a negative cell terminal 12 near an opposite second narrow side of the cap assembly 14. The battery module 5 shown in FIG. 1 has a 1p8s configuration, that is, the battery module 5 has eight battery cells 10 connected in series and no battery cells 10 connected in parallel. In the battery module 5, the terminals of adjacent ones of the battery cells 10 are of opposite polarity and are connected to each other via a respective busbar 17. However, in a battery module having a XpYs configuration, X battery cells 10 are connected in parallel within the battery module, Y groups of X parallel-connected battery cells 10 are connected to each other in series via respective busbars 17, and the terminals of such adjacent battery cell groups are of opposite polarity. Busbars 17 following each other along the current path of the battery module 5 are generally arranged on different sides of the battery module 5 (e.g., near opposite narrow side surfaces 16).

The battery module 5 as shown in FIG. 1 further includes a cell supervision circuit carrier (CSCC) 18. The CSCC may be, for example, a substrate that is configured to receive a CSC 31 or a substrate that includes or constitutes a CSC 31. The CSCC 18 also includes a connector 20 for establishing data communication with the CSC 31. The CSC 31 may receive cell voltages and/or temperatures from the plurality of battery cells 10. Therefore, an electric and/or thermal connection may be established between the CSC 31 and the plurality of battery cells 10 via the CSCC 18. Such connections may be established by wire or weld connections, with weld connections being more stable and providing good signal transmission. The CSCC 18 may overlap with the busbars 17 or with the cell terminals 11, 12 of the battery module 5 to receive cell voltages of the battery cells 10 via the weld connections (or weld pads) 19. Thus, the CSCC 18 may span the battery module 5, in a width direction, at least the distance between the busbars 17 that follow each other along the current path of the module 5. For example, the CSCC 18 may span the distance between the cell terminals 11, 12 of a battery cell 10, which may be nearly the entire width of a battery cell 10.

The CSCC 18 according to the related art that is connected to a plurality of cell terminals 11, 12 or busbars 17 of a battery module 5 may thus extend along the entire length and nearly the entire width of the battery module 5 and, therefore, may be material-consuming. Even if the CSCC 18 is further shaped at a later stage, the amount of substrate material that is used depends on the raw panel size.

SUMMARY

Embodiments of the present invention provide a battery module with a cell supervision circuit carrier that has reduced substrate material (or size), which reduces the cost of manufacturing the battery module. According to an embodiment, a battery module includes a plurality of aligned battery cells. The plurality of battery cells may be stacked in a lengthwise direction of the battery module. According to an embodiment, the battery module includes a plurality of stacked prismatic battery cells. Each of the battery cells may further include a cell case and a cap assembly on (e.g., closing or sealing) the cell case. According to an embodiment, the battery cell includes an electrode assembly, a negative cell terminal, and a positive cell terminal. According to an embodiment, the positive cell terminals of the battery cells may be either constituted by or at least connected to the cell case of the respective battery cell of the battery module.

The battery module further includes a plurality of busbars that are on top of the cap assemblies of the battery cells (e.g., above the cap assemblies). Each of the busbars may be configured to electrically connect the cell terminals of at least two battery cells to each other. However, the number of battery cells connected to each other via one busbar may depend on the number of battery cells connected to each other in parallel within the battery module. Together, the plurality of busbars may be configured to transport (or transmit) the electric current of the battery module to, for example, external consumers.

The battery module further includes a cell supervision circuit carrier (CSCC), which may host (e.g., accommodate), or may be configured to host, a cell supervision circuit (CSC). The CSC may refer to or may include a microprocessor, an ASIC, or any suitable (integrated) circuit that is configured to receive signals corresponding to the voltage and/or temperature of at least one battery cell of the battery module. The CSC may be further configured to process, analyze, and/or store the received signals. The CSC may be further configured to transmit signals related to the received signals to another CSC and/or to a battery management system (BMS). The CSC may be configured to perform at least one control function with respect to the battery module or with respect to at least one battery cell thereof. The control functions may include measurements or determinations related to cell voltages, cell currents, cell resistances, and/or cell capacities. The control functions may further include active or passive balancing of cell voltages or cell currents of the battery cells of the battery module.

The CSCC may be a substrate that is configured to be connected to the CSC or to receive the CSC thereon or therein. For example, the substrate may provide a suitable chip socket, landing pads, or wire frame for a CSC. The CSCC may further include a connector that is configured to establish data communication with the CSC. According to an embodiment, wherein the CSC is received on or in the CSCC, the connector may establish data communication between the CSC received on or in the CSCC and another CSC and/or a BMS or an external control unit (e.g., a control unit of an external consumer). According to another embodiment, the CSC may be connected to the CSCC via the connector itself. For example, the CSC may not be on or in the CSCC but may be external to the CSCC substrate and be data connected to the CSCC and, in some embodiments, may also be power connected to the CSCC via the connector. The CSC may be further configured to communicate with another CSC and/or a BMS via the connector or via another signaling port.

Each battery module of a battery system may include a CSCC and may be configured for daisy chain communication with a BMS. For example, the CSCs may be configured to transmit and receive digital and/or analogous signals (e.g., differential signals) via the connectors or via another signaling port connecting the CSCs to each other and/or to a BMS. The signals may be modulated on alternating currents. Because this type of communication is less dependent on the voltage levels of the individual battery modules, it is less error-prone and, thus, secure communication may be provided between unbalanced battery modules.

According to an embodiment of the present invention, the CSCC may be configured to electrically connect the CSC to the negative cell terminal of one battery cell. The one battery cell may be one of the plurality of battery cells of the battery module or may be one battery cell of another battery module (e.g., one battery cell of another battery module of the same battery system). The latter embodiment is described in more detail below with respect to a battery system. The CSCC according to an embodiment of the present invention may be further configured to electrically connect the CSC to the cell cases of at least some of the remaining (or other) battery cells of the plurality of battery cells. Therein, the CSC may receive signals corresponding to the voltage of each battery cell connected thereto via the CSCC and also via the connector of the CSCC. The CSCC may be electrically connected to the negative cell terminal of one of the plurality of battery cells and to the cell cases of at least some of the remaining battery cells of the plurality of battery cells. When the CSC is connected, via the CSCC, to the cell cases of most of the battery cells instead of to the terminals of these battery cells or to the busbars connected to these terminals, the area (e.g., the surface area) of the CSCC may be significantly reduced.

According to an embodiment of the battery module, the plurality of aligned battery cells may include a plurality of subsets of battery cells. Each subset of battery cells may include battery cells connected to each other in parallel, and the subsets of battery cells may be connected to each other in series within the battery module. In this embodiment, the CSCC may be configured to electrically connect the CSC to the negative cell terminal of at least one battery cell and, in some embodiments, to each battery cell, of one subset of battery cells. The CSCC may be further configured to electrically connect the CSC to the cell case(s) of at least one battery cell and, in some embodiments, to each battery cell, of at least some of the remaining subsets of battery cells. In this embodiment, the CSC may receive signals corresponding to the voltage of each battery subset connected thereto via the CSCC. For example, the CSCC may be electrically connected to the cell case of at least one battery cell of each subset of battery cells. Then, the CSC may receive signals corresponding to the voltage of each battery subset of the battery module. The CSCC may be configured to connect the CSC to the cell cases of each of the remaining battery cells. Then, the CSC may receive signals corresponding to the voltage of each battery cell (e.g., each battery cell of each battery subset) of the battery module.

In one embodiment, a plurality of weld pads may be on an underside of the CSCC when the CSCC is electrically connected to battery cells of the battery module as described above. The weld pads may be configured on an underside (e.g., a lower surface) of the CSCC and may be further configured to facilitate a connection (e.g., an electric connection, a mechanical connection, and/or a weld connection) between the CSCC and a battery cell terminal, busbar, or cell case, respectively. In another embodiment, the weld pads may be formed on an underside of the CSCC during a process of electrically and/or mechanically connecting the CSCC to battery cell terminals, busbars, or cell cases of the battery module (e.g., by welding). The weld pads may be configured to facilitate a connection (e.g., an electric connection, a mechanical connection, and/or a weld connection) between the CSCC and a battery cell terminal, busbar, or cell case, respectively, or may be formed during laser welding or an ultrasonic welding process. In another embodiment, the weld pads may be configured to facilitate solder connections or even wire connections. In another embodiment, a first weld pad may be connected to a negative terminal of a battery cell of the battery module (e.g., of an outermost battery cell of the battery module), and the remaining weld pads may be individually connected to the cell cases of the remaining battery cells of the module. Further, each of the weld pads may be configured to tap (e.g., to monitor) cell voltages of the battery cell to which it is connected (e.g., to provide an ohmic connection to the terminal or the case of the battery cell).

In one embodiment, the CSCC may be configured to receive (or accommodate) the CSC on a top side (e.g., a top surface) thereof. For example, the CSC may be on a top side (e.g., a top surface) of the CSCC (e.g., the CSC may be surface mounted to the top side of the CSCC). In another embodiment, the CSC, mounted to the CSCC, may be electrically connected to each of the weld pads as described above. Because each of the weld pads provides an ohmic connection to a battery cell of the battery module, the CSC may be electrically connected to each of these cells. The electrical connections between the CSC and the weld pads may be at least partially provided by conductive lines (e.g., by planar conductive structures on and/or along a surface of the CSCC). The conductive lines may be formed by surface metallizations, conductive inks, and the like. The electrical connections between the CSC and the weld pads may be at least partially provided by opening (e.g., through hole) vias extending from a top side to a lower side of the CSCC and through the material of the CSCC.

According to another embodiment, a temperature sensor may be on a top side of the CSCC and overlap at least one of the weld pads on an underside of the CSCC. The at least one weld pad provides a good thermal connection between the battery cell (e.g., terminal or case of the battery cell) to which it is connected and the temperature sensor, while the CSCC in between the weld pad and the temperature sensor provides electric insulation between the weld pad and the temperature sensor. The temperature sensor may be a thermistor-based temperature sensor (e.g., a NTC sensor). Such a sensor may include a temperature-dependent resistor connecting two conductive pads (e.g., copper metallizations) to each other, where each conductive pad may be further connected to a measurement circuit to receive a probe signal. The conductive pads may be in a projected area of the corresponding weld pad. For example, the projected area may be a metallization having substantially the same dimension as that of the combined conductive pads and may be on an underside of the CSCC. The overlapping conductive pads on the top side and the underside of the CSCC may increase the thermal connectivity from the battery cell to the temperature sensor.

According to one embodiment, one of the busbars may include a protrusion overlapping the CSCC, and the remaining busbars may not overlap (e.g., may be offset from) the CSCC. The remaining busbars may include an electrically conductive material (e.g., aluminum) and may have a strip-like shape with a substantially uniform width and a substantially uniform height. The one busbar may have similar constitution as the remaining busbars but may include a protrusion extending therefrom in a direction dissimilar (e.g., substantially perpendicular) to an extension direction of the busbar between two connected cell terminals. However, the protrusion may be combined with other busbar shapes (e.g., curved busbar shapes) as well. That is, the shape of the busbars may be suitably varied according to different battery designs (e.g., in view of a limited installation space). For example, the busbar may have a straight, bent, or arbitrarily curved shape, such as a belt, band, ribbon, rib, or rail. This embodiment allow the use and arrangement of a strip-shaped CSCC next to the remaining busbars for easy connection to the cell cases, where one weld pad connects the CSCC to the busbar protrusion to provide an electrical connection between the CSCC and the electrical terminal of one battery cell (e.g., an outermost battery cell) of the battery module. The busbar(s) with the protrusion may be an outermost busbar of the battery module that is connected to an outermost battery cell of the battery module.

Figure 2:
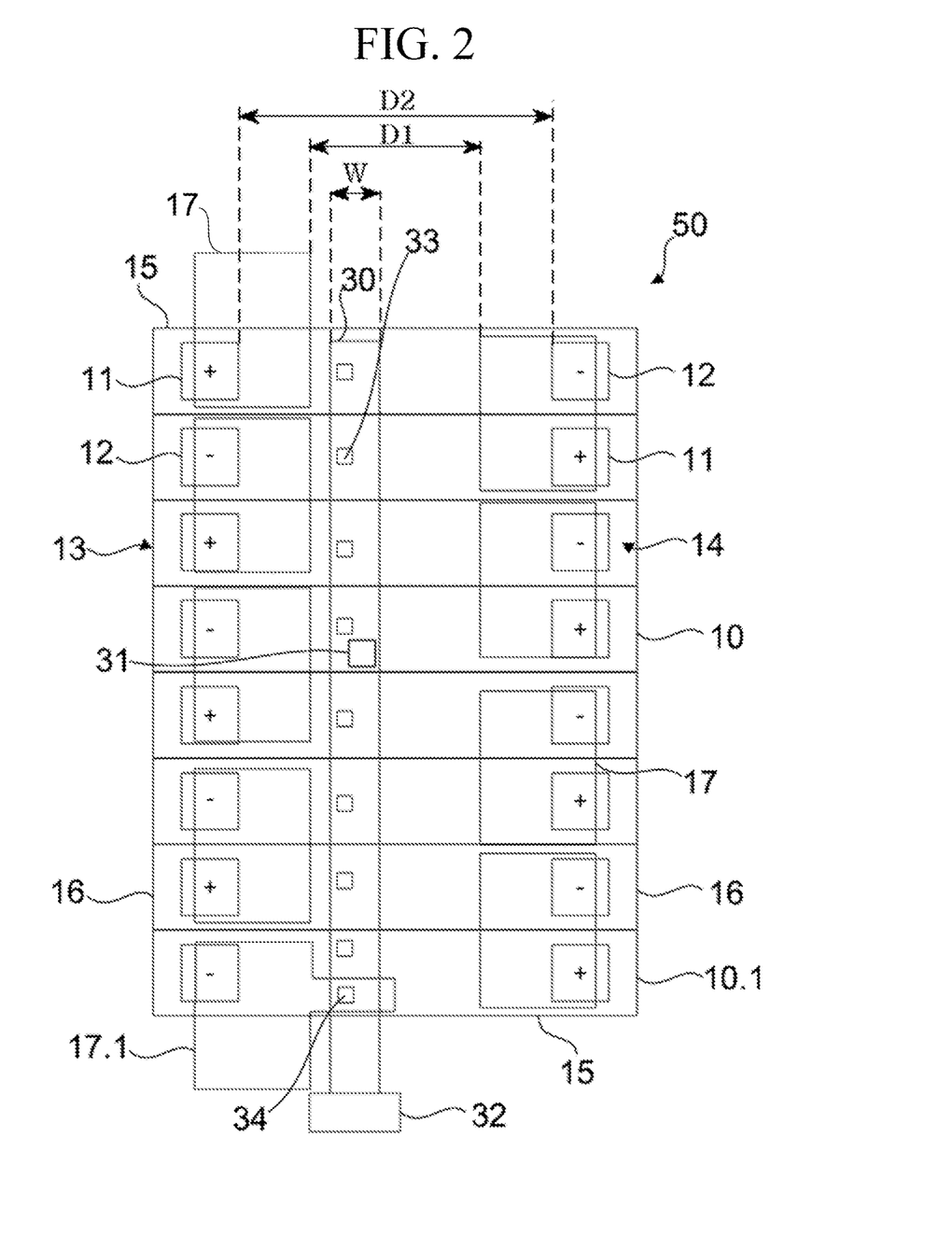
FIG. 2 is a schematic illustration of a top view of a battery module according to an embodiment of the present invention.

The CSCC may be a flexible circuit board (FCB). For example, the FCB may be (or may include) a flexible substrate commonly used for flexible printed circuits, such as, for example, polyimide, PEEK, or transparent conductive polyester film. Any conducting surface structures as described above (e.g., weld pads or conductive lines) may be printed (e.g., screen-printed) onto the substrate. The CSCC may extend along a length direction of the battery module (e.g., along the entire length of the battery module in the stacking direction of the battery cells). The CSCC may have a width (W, as illustrated in FIG. 2) (e.g., a spatial extension in a width direction of the battery module substantially perpendicular to the stacking direction of the battery module) that is less than the distance between adjacent busbars (D1, as illustrated in FIG. 2), such as, for example, adjacent busbars following each other along the current path of the battery module. For example, the CSCC may have a width that is less than the distance between the terminals of a battery cell (D2, as illustrated in FIG. 2). Because the distance between the terminals of most battery cells is significantly less than the battery cell width, the CSCC may have a width that is significantly less than the battery cell width, for most batteries. Again, the CSCC allows for reduced material costs.

In one embodiment, the CSCC may include a FCB, as described above, and the FCB may include a first lateral edge and a second lateral edge that is opposite to the first lateral edge. For example, the FCB may have a substantially rectangular shape that may be adapted to the dimensions of a substantially rectangular battery module to which the FCB is mounted. The connector may be at a first lateral edge of the FCB.

The FCB and/or the CSCC may include at least one curved section between adjacent weld pads. For example, the FCB may not be completely strip-shaped but may include a curvature in any spatial direction between two weld pads. Hence, the FCB may not connect the weld pads along a shortest distance there between, and a material reservoir of the FCB may be between the weld pads. The material reservoir allows the FCB to compensate for cell swelling or other spatial displacements of the battery cells in the battery module. Hence, by a minor amendment (e.g., modification) of the FCB and/or CSCC, the battery module may allow sufficient electric contact between the CSC and the battery cells even when there is cell swelling or spatial displacement of the battery cells. For example, the curved section of the FCB in between two weld pads may be curved in a height direction of the battery module.

Other embodiments of the present invention are directed to a battery system that may include a plurality of battery modules according to embodiments of the present invention, as described above, in which the battery modules are configured to communicate with a BMS and/or with each other. The battery system may include a plurality of identical battery modules, each including the same number of battery cells that are stacked in the same way. The battery system may include a plurality of identical CSCCs, each being adapted to the size and the shape of the corresponding battery module. Each of the CSCCs may include a FCB having a substantially rectangular shape with a first lateral edge and a second lateral edge that is opposite to the first lateral edge. Further, each FCB may include a connector that is arranged at a lateral edge thereof. Hence, interchangeability of the system's components (e.g., in a daisy chain setup with a BMS) may be increased while the number of spare parts may be decreased.

According to one embodiment, the battery system may include a plurality of battery modules (e.g., at least one first battery module and at least one second battery module), each of which includes a plurality of aligned battery cells. Further, each of the battery cells may include a cell case, a cap assembly placed on the cell case, a negative cell terminal, and a positive cell terminal, and the battery module may include a plurality of busbars on top of the cap assemblies. Further, each of the busbars may be configured to electrically connect cell terminals of at least two battery cells to each other. Each battery module may include a CSCC configured to host a CSC and including a connector configured to establish data communication with the CSC. The CSCC of at least one first battery module may be configured to electrically connect the CSC to the negative cell terminal of one battery cell of the second battery module and to the cell cases of at least some of the remaining battery cells of the first battery module. For example, the one terminal voltage of the CSC of a first battery module may also be tapped from a terminal or busbar of a second battery module.

Other embodiments of the present invention are directed to a method of assembling a CSCC to a battery module. For example, the CSCC may be configured to host (or accommodate) a CSC and may include a connector configured to establish data communication with the CSC. For example, the battery module, as described in more detail above, may include a plurality of aligned battery cells, and each of the battery cells includes a cell case, a cap assembly placed on the cell case, a negative cell terminal, and a positive cell terminal. A method of assembling the CSCC to the battery module, according to an embodiment of the present invention, may include at least: fixing (e.g., fixating or adsorbing) the CSCC to an underside of a vacuum tool by applying an under pressure (e.g., a vacuum) to the CSCC via the vacuum tool, positioning the CSCC over the battery module via the vacuum tool, and electrically connecting the CSCC to the negative cell terminal of one battery cell (e.g., to the negative cell terminal of one battery cell of the plurality of battery cells) and to the cell cases of at least some of the remaining battery cells (e.g., to each of the remaining battery cells) from among the plurality of battery cells. The underside of the vacuum tool may be sized according to the CSCC, and at least one suction opening (e.g., suction hole) for providing the under pressure to fix and lift the CSCC may be in the underside of the vacuum tool.

The vacuum tool may include a plurality of welding openings (e.g., welding through-holes) that extend from an upper side of the vacuum tool to the lower side (e.g., the underside) of the vacuum tool. Thus, an apparatus for connecting the CSCC to the battery cell terminal and/or to the cell cases (e.g., a welding apparatus) may be guided through the vacuum tool and, thus, the connection process (e.g., welding process) may be easily performed. The lower side of the vacuum tool may have at least one curved portion between adjacent welding openings (e.g., a curved portion with a curvature in the height direction of the battery module, such as, for example, in a direction towards the upper side of the vacuum tool). The curved portions may allow for fixing a CSCC to the battery module via a plurality of weld pads with curved portions between adjacent weld pads. Hence, this embodiment allows for a battery module that can compensate for (or accommodate) cell swelling. Therefore, the CSCC may be weld connected to a negative terminal of an outermost one of the battery cells and to the cell cases of the remaining battery cells of the battery module, and at least one curved portion of the CSCC is between adjacent weld pads.

Another embodiment of the present invention relates to an electric vehicle that includes a battery module, a plurality of battery modules, and/or a battery system as described above.

Further aspects of embodiments of the present invention are disclosed in the appended drawings and in the following description thereof.

BRIEF DESCRIPTION OF THE DRAWINGS

Aspects and features of embodiments of the present invention will become apparent to those of ordinary skill in the art by describing, in detail, exemplary embodiments thereof with reference to the attached drawings in which.

DETAILED DESCRIPTION

Reference will now be made in detail to embodiments, examples of which are illustrated in the accompanying drawings. Aspects and features of the exemplary embodiments, and implementation methods thereof, will be described with reference to the accompanying drawings. In the drawings, like reference numerals denote like elements, and redundant descriptions may be omitted. Also, in the drawings, the relative sizes of elements, layers, and regions may be exaggerated for clarity. The present invention, however, may be embodied in various different forms and should not be construed as being limited to the illustrated embodiments and their corresponding descriptions herein. Rather, these embodiments are provided as examples so that this disclosure will be thorough and complete and will fully convey the aspects and features of the present invention to those skilled in the art. Processes, elements, and techniques not necessary for those of ordinary skill in the art to have a complete understanding of the aspects and features of the present invention may be omitted.

As used herein, the term "and/or" includes any and all combinations of one or more of the associated listed items. Further, the use of "may" when describing embodiments of the present invention refers to "one or more embodiments of the present invention." In the following description of embodiments of the present invention, the terms of a singular form may include plural forms unless the context clearly indicates otherwise. Expressions, such as "at least one of," when preceding a list of elements, modify the entire list of elements and do not modify the individual elements of the list.

It will be understood that although the terms "first," "second," etc. are used to describe various elements, these elements should not be limited by these terms. These terms are only used to distinguish one element from another element. For example, a first element may be named a second element and, similarly, a second element may be named a first element, without departing from the scope of the present invention. As used herein, the terms "substantially," "about," and similar terms are used as terms of approximation and not as terms of degree and are intended to account for the inherent deviations in measured or calculated values that would be recognized by those of ordinary skill in the art. Further, if the term "substantially" is used in combination with a feature that could be expressed using a numeric value, the term "substantially" denotes a range of +/−5% of the value centered on the value.

The battery system according to the related art, as illustrated in FIG. 1, has already been described in the introductory part of the present application. As already mentioned there, the CSCC 18, according to the related art, extends, at least in an initial state, in a width direction for more than the distance between adjacent busbars 17 to overlap the busbars 17 along both sides of the battery module 5. Hence, material costs for manufacturing the CSCC substrate are high.

FIG. 2 illustrates a schematic top view of a battery module 50 according to an embodiment. Therein, the battery module 50 includes battery cells 10 connected in series and, thus, has an 8s1p configuration, but the present invention is not limited to this configuration. Therein, the battery module 50 shown in FIG. 2 may be similar to the battery module 5 shown in FIG. 1 and the busbar 17 configuration in the battery module 50 may be similar to the configuration of the busbar 17 in the related art battery module 5. However, a busbar 17.1 that is electrically connected to a negative cell terminal 12 of an outermost battery cell 10.1 may differ from the corresponding busbar 17 of the related art battery module 5. For example, the busbar 17.1 of the battery module 50 includes a protrusion extending from the busbar 17.1 in a direction substantially perpendicular to a direction between the cell terminals 11, 12 of adjacent battery cells 10 (e.g., the protrusion of the busbar 17.1 may extend in a direction parallel to a length of the corresponding battery cell 10).

The shape of the busbar 17.1 allows it to be electrically connected to the negative cell terminal 12 of the outermost battery cell 10 and electrically connected to the cell supervision circuit carrier (CSCC) 30 via a first weld pad 34 on an underside of the CSCC 30. The CSCC 30 may be connected to the cell case 13 of each of the remaining battery cells 10 of the battery module 50 via a respective weld pad 33. Hence, a voltage (e.g., a positive voltage) signal of each battery cell 10 relative to the ground potential voltage of the negative cell terminal 12 of the outermost battery cell 10.1 may be provided to a cell supervision circuit (CSC) 31 on the CSCC 30. The CSCC 30 may not overlap with the busbars 17 on both sides of the battery module 50 and may be a thin strip flexible circuit board (FCB). The FCB may be arranged next to (e.g., offset from) the busbars 17 above the cap assemblies 14 of the aligned battery cells 10. Thus, the CSCC 30 has a drastically decreased surface area when compared with the related art CSCC 18, even in an initial state of the raw FCB, which results in reduced material costs. Further, a connection between the CSC 31 and other CSCs 31 or a battery management system (BMS) may be provided via a connector 32 on the CSCC 30.

Figure 3:
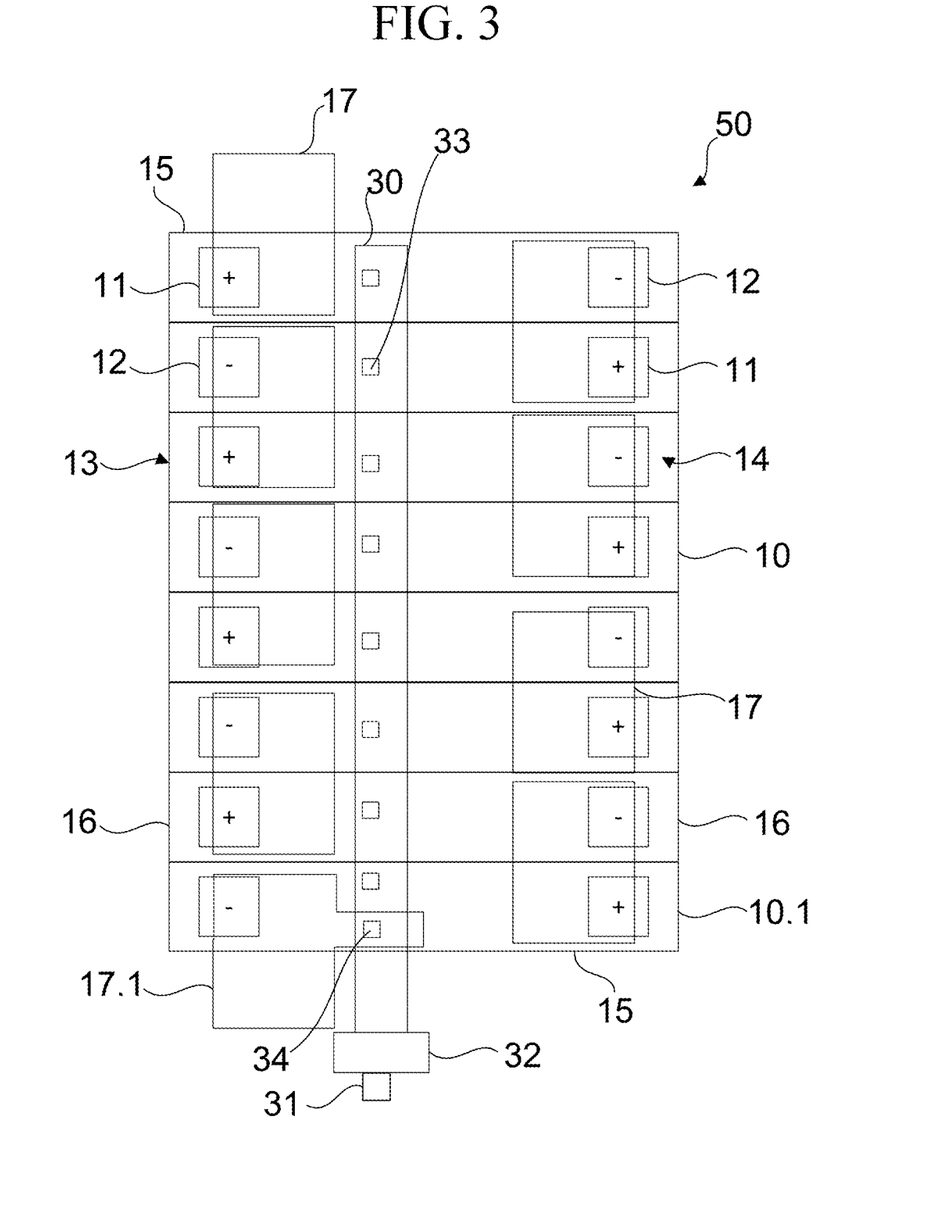
FIG. 3 is a schematic illustration of a top view of a battery module according to an another embodiment of the present invention.

FIG. 3 illustrates a schematic top view of a battery module 50 according to another embodiment. The differences between the battery module 50 shown in FIG. 2 and the battery module 50 shown in FIG. 3 will primarily be described and some identical or substantially similar features therein may be omitted. In the battery module 50 shown in FIG. 3, a CSC 31 is not disposed on the CSCC 30 but is rather connected to the CSCC 30 via the connector 32. For example, the CSC 31 may be separate from the CSCC 30 and data connected, and, in some embodiments, also power connected to the CSCC 30 via the connector 32. The CSC 31 is connected to the battery cells 10 of the battery module 50 via the CSCC 30, which includes the connector 32. According to the embodiment shown in FIG. 3, the function of the connector 32 may differ from the function of the connector 32 in the embodiment illustrated in FIG. 2. However, in the embodiment shown in FIG. 3, the connector 32 may connect the CSC 31 to other CSCs 31 or to a BMS (e.g., via a daisy chain). The CSC 31 may also include an additional signal port for such a connection.

Figure 4:
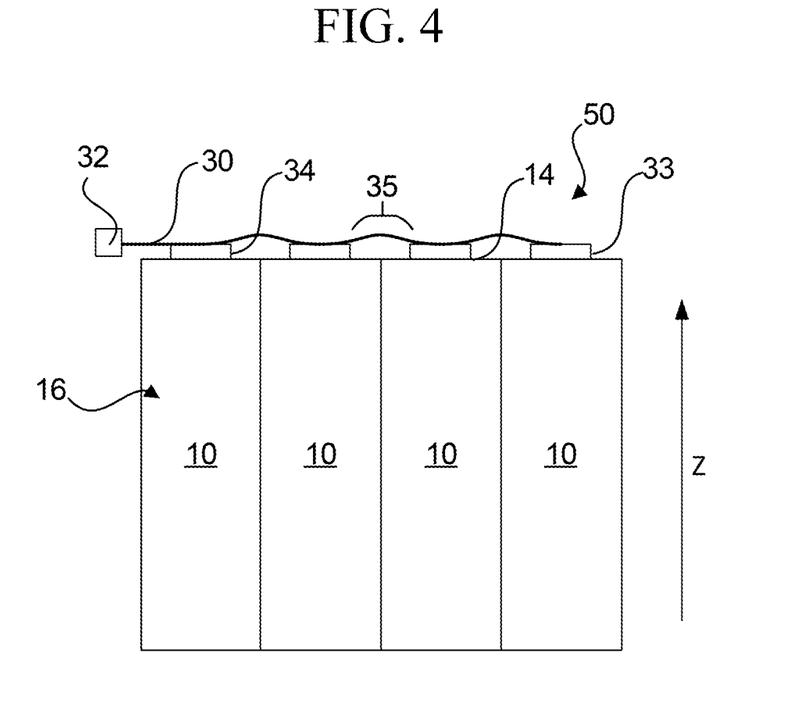
FIG. 4 is a schematic illustration of a side view of a battery module according to an embodiment of the present invention.

A schematic side view of the battery module 50 according to an embodiment is illustrated in FIG. 4. As shown in FIG. 4, the CSCC 30 may be connected to each battery cell 10 via a respective weld pad 33, 34 on an underside of the CSCC 30. The CSCC 30 may terminate at one end at the connector 32 that is configured to connect the CSC 31 (e.g., the connector 32 may be at one end of the CSCC 30), as shown in FIG. 2, to the CSC 31 of another battery module or to a BMS. As illustrated in FIG. 4, the CSCC 30 may include a plurality of curved sections 35, and each curved section 35 may be positioned between adjacent weld pads 33, 34. Therein, each curved section 35 may be curved in a positive Z-direction, which is a height direction of the battery module 50. Thus, material reservoirs of the CSCC 30 are formed between the adjacent weld pads 33, 34 and, thus, the CSCC 30 can compensate for (or accommodate) any swelling of the battery cells 10, thereby improving the long-term stability of the battery module 50.

Figure 5:
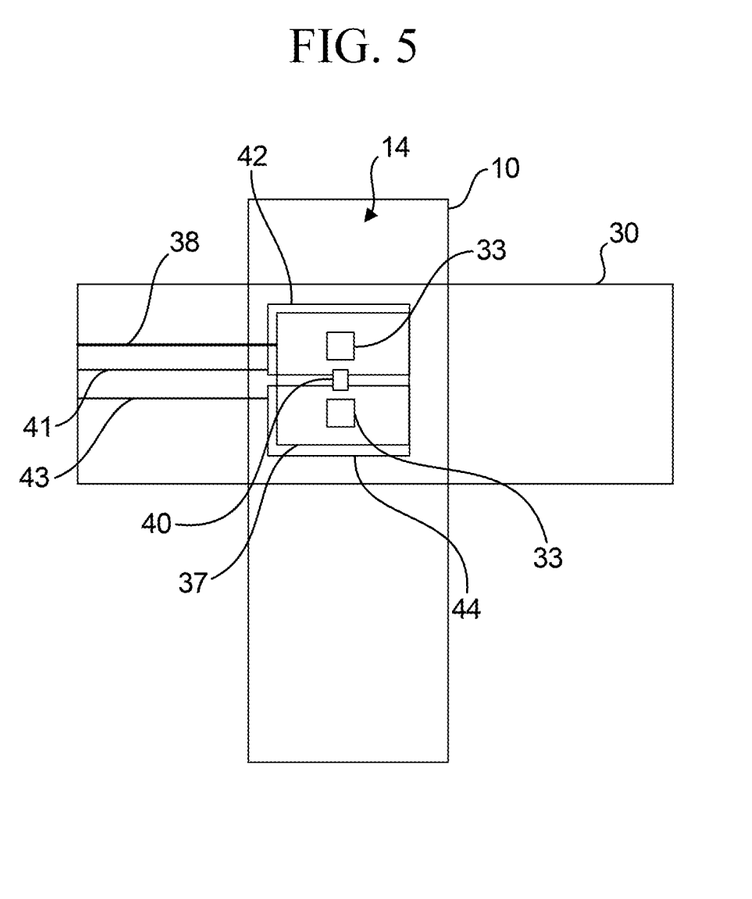
FIG. 5 is a schematic illustration of a top view of a temperature sensor mounted to a battery module according to an embodiment of the present invention.

FIG. 5 illustrates a schematic top view of a temperature sensor 40 mounted to the battery module 50 according to an embodiment. The temperature sensor 40 (e.g., a NTC thermistor), may be mounted to a top side (e.g., a top surface) of the CSCC 30, which is over a cap assembly 14 of a battery cell 10 of the battery module 50. When the temperature sensor 40 is an NTC thermistor, it may be electrically connected to a first conductive pad 42 and to a second conductive pad 44, that together provide probe voltage to the NTC thermistor. The first and second conductive pads 42, 44 may, therefore, be connected to a voltage source via first and second conductive lines 41, 43 formed on the top side of the CSCC 30, respectively. On the lower side (e.g., a lower or bottom surface) of the CSCC 30, two weld pads 33, as described above, are arranged for connecting the CSCC 30 to the cap assembly 14 of the battery cell 10. A bottom metallization 37 is formed on the lower side of the CSCC 30 around the weld pads 33, and connected with a conductive line 38. The bottom metallization 37 may have the same or substantially the same dimension as the combination of the first and second conductive pads, 42, 44 (e.g., the bottom metallization 37 may overlap both of the first and second conductive pads 42, 44). Hence, an improved thermal connection may be provided between the cap assembly 14 of the battery cell 10 and the temperature sensor 40, and thus, temperature measurements via the temperature sensor 40 may be improved. The battery module 50 according to an embodiment may include one or more than one such temperature sensor 40.

Figure 6A:
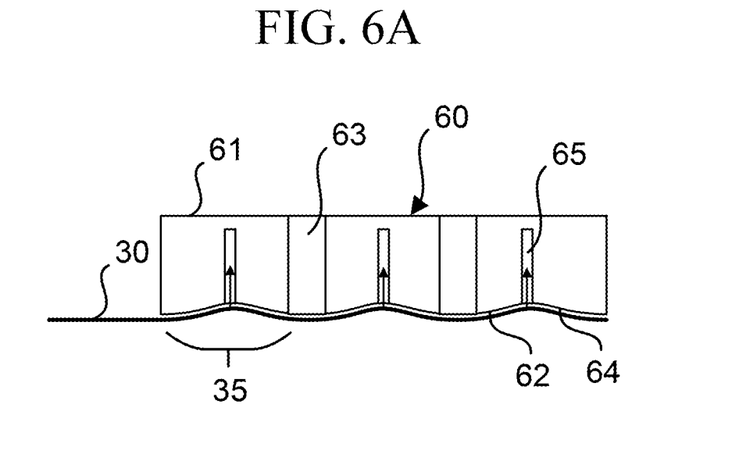
FIG. 6(A) is a schematic illustration of a side view of a CSCC fixed to a mounting tool during a method according to an embodiment of the present invention.
Figure 6B:
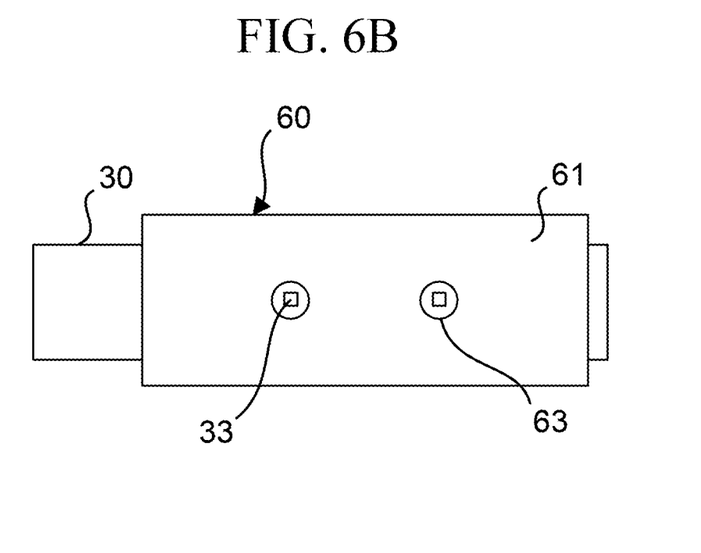
FIG. 6(B) is a schematic illustration of a top view of the CSCC fixed to the mounting tool shown in FIG. 6(A).

A method for assembling a CSCC 30 to a battery module 50, according to an embodiment, is illustrated in FIGS. 6(A) and 6(B), which are a schematic side view and a schematic top view, respectively, of the CSCC 30 fixed to a vacuum tool 60. The vacuum tool 60 includes a plurality of suction openings (e.g., suction holes) 65, each of which is configured to provide an under pressure (e.g., a vacuum) to an upper side of the CSCC 30 for fixating the CSCC 30 to a lower side 62 of the vacuum tool 60. The lower side 62 of the vacuum tool 60 has a plurality of curved portions 64 that are curved in the positive Z-direction of a battery module (e.g., towards the upper side 61 of the vacuum tool 60). Hence, by sucking the flexible CSCC 30 to the lower side 62 of the vacuum tool 60 via the suction openings 65, the curved sections 35 are formed in the CSCC 30.

The vacuum tool 60 also has a plurality of welding openings (e.g., welding through-holes) 63 that extend from the upper side 61 of the vacuum tool 60 to the lower side 62 thereof. Hence, a welding assembly may be guided through the welding openings 63 for connecting the CSCC 30 disposed below the vacuum tool 60 to a battery cell 10 via a respective weld pad 33.

SOME REFERENCE NUMERALS 5 battery module (related art)
10 battery cell
10.1 outermost battery cell
11 positive terminal
12 negative terminal
13 cell case
14 cap assembly
15 wide side surface
16 narrow side surface
17 busbar
17.1 busbar with protrusion
18 cell supervision circuit carrier (related art)
19 weld pad (related art)
20 connector (related art)
30 cell supervision circuit carrier (CSCC)
31 cell supervision circuit (CSC)
32 connector
33 weld pad
34 first weld pad
35 curved section
37 bottom metallization
38 conductive line
40 temperature sensor
41 first conductive line
42 first conductive pad
43 second conductive line
44 second conductive pad
50 battery module
60 vacuum tool
61 upper side
62 lower side
63 welding opening
64 curved portion
65 suction opening

The invention claimed is:

1. A battery module comprising:
   a plurality of aligned battery cells, each of the battery cells comprising a cell case, a cap assembly on the cell case, a negative cell terminal, and a positive cell terminal;
   a plurality of busbars over the cap assemblies, the busbars electrically connecting at least one of the negative and positive cell terminals of each of at least two of the battery cells to each other;
   a cell supervision circuit carrier, the cell supervision circuit carrier being electrically connected to the negative cell terminal of one of the battery cells and respectively electrically connected to the cell cases of at least some of the other battery cells from among the plurality of battery cells by individual conductive lines and/or vias; and
   a cell supervision circuit configured to continuously receive a ground potential cell voltage of a negative cell terminal of the one of the battery cells and positive cell voltages of the at least some of the other battery cells via the cell supervision circuit carrier and to compare the positive cell voltages to the ground potential cell voltage of the one of the battery cells.

2. The battery module according to claim 1, wherein the plurality of aligned battery cells comprises a plurality of subsets of battery cells connected to each other in parallel, the subsets of battery cells being connected to each other in series, wherein the one of the battery cells that is electrically connected to the cell supervision circuit is in one of the subsets of battery cells, and wherein the cell supervision circuit carrier electrically connects the cell supervision circuit to the cell case of at least one battery cell of at least some of the other subsets of battery cells.

3. The battery module according to claim 1, wherein the cell supervision circuit carrier is configured to connect the cell supervision circuit to the cell cases of each of the other battery cells.

4. The battery module according to claim 1, further comprising a plurality of weld pads on an underside of the cell supervision circuit carrier, wherein a first weld pad is connected to a negative terminal of an outermost one of the battery cells, and the other weld pads are respectively connected to the cell cases of the other battery cells.

5. The battery module according to claim 4, wherein the cell supervision circuit is on a top side of the cell supervision circuit carrier and is electrically connected to each of the weld pads.

6. The battery module according to claim 5, wherein the electric connections between the cell supervision circuit and respective ones of the weld pads are at least partially provided by the individual conductive lines and/or vias.

7. The battery module according to claim 4, further comprising a temperature sensor on a top side of the cell supervision circuit carrier and overlapping at least one of the weld pads or a metallization around at least one of the weld pads.

8. The battery module according to claim 1, wherein the positive cell terminals are either constituted by or connected to the cell cases.

9. The battery module according to claim 1, wherein one of the busbars comprises a protrusion overlapping the cell supervision circuit carrier, the cell supervision circuit carrier being connected to the one of the busbars at the protrusion, and wherein the other busbars are next to the cell supervision circuit carrier.

10. The battery module according to claim 1, wherein the cell supervision circuit carrier comprises a flexible circuit board extending along a length direction of the battery module and having a width less than a distance between adjacent busbars and/or less than a distance between the terminals of one of the battery cells.

11. The battery module according to claim 10, further comprising a plurality of weld pads on an underside of the cell supervision circuit carrier, wherein the flexible circuit board has a curved section between adjacent weld pads.

12. The battery module according to claim 11, wherein the curved section is curved in a height direction of the battery module.

13. The battery module according to claim 1, wherein the cell supervision circuit carrier is electrically connected to the negative cell terminal of the one of the battery cells and to the cell case of the one of the battery cells.

14. A method for assembling the cell supervision circuit carrier to the battery module according to claim 1, the cell supervision circuit carrier being configured to host the cell supervision circuit and comprising a connector configured to establish data communication with the cell supervision circuit, the method comprising:

fixing the cell supervision circuit carrier to a lower side of a vacuum tool by applying a vacuum to the cell supervision circuit carrier via the vacuum tool, positioning the cell supervision circuit carrier over the battery module via the vacuum tool, and electrically connecting the cell supervision circuit carrier to the negative cell terminal of the one of the battery cells and to the cell cases of the at least some of the other battery cells.

15. The method of claim 14, wherein the vacuum tool comprises a plurality of welding openings extending from an upper side to the lower side of the vacuum tool.

16. The method of claim 15, wherein the lower side of the vacuum tool has a curved portion between adjacent ones of the welding openings.

17. The method of claim 14, wherein the cell supervision circuit carrier is welded to a negative terminal of an outermost one of the battery cells and to the cell cases of the other battery cells, and wherein the cell supervision circuit carrier has a curved section between adjacent weld pads on an underside of the cell supervision circuit carrier.

* * * * *